United States Patent [19]
Fishbein

[11] Patent Number: 5,159,515
[45] Date of Patent: Oct. 27, 1992

[54] PROTECTION CIRCUIT FOR POWER FETS IN A HALF-BRIDGE CIRCUIT

[75] Inventor: Jeff Fishbein, Hawthorne, Calif.

[73] Assignee: International Rectifier Corporation, El Segundo, Calif.

[21] Appl. No.: 856,864

[22] Filed: Mar. 24, 1992

Related U.S. Application Data

[63] Continuation of Ser. No. 504,972, Apr. 5, 1990, abandoned.

[51] Int. Cl.[5] .............................................. H02H 7/122
[52] U.S. Cl. ........................................ 361/18; 361/86; 363/56; 363/134
[58] Field of Search .................... 307/570; 361/18, 86; 363/24–26, 56, 134, 132

[56] References Cited

U.S. PATENT DOCUMENTS

| | | | |
|---|---|---|---|
| 4,213,103 | 7/1980 | Birt | 332/9 T |
| 4,316,243 | 2/1982 | Archer | 363/132 |
| 4,685,040 | 8/1987 | Steigerwald et al. | 363/17 |
| 4,829,415 | 5/1989 | Haferl | 363/56 |
| 4,970,620 | 11/1990 | Cehnhoff | 361/18 |

FOREIGN PATENT DOCUMENTS 0166222  7/1986  Japan ............................. 307/570

Primary Examiner—Steven L. Stephan
Assistant Examiner—Adolf Berhane
Attorney, Agent, or Firm—Ostrolenk, Faber, Gerb & Soffen

[57] ABSTRACT

A small size FET has its drain connected to the gate of a high-side power FET of an N-channel half-bridge circuit and its gate connected to the gate of the low-side power FET of the half-bridge circuit. The source of the small FET is connected to ground. If both the high side and low side power FETs receive gate turn-on signals simultaneously, the protection FET turns on and pulls the gate of the high side FET to ground to turn it off. A layout of the FETs on leadframe segments is disclosed so that the small FET is physically adjacent to the two power FETs such that a very short distance exists between the power FETs and their connection points to the control FET.

15 Claims, 1 Drawing Sheet

PROTECTION CIRCUIT FOR POWER FETS IN A HALF-BRIDGE CIRCUIT this is a continuation of application Ser. No. 07/504,972, filed on Apr. 5, 1990, now abandoned.

BACKGROUND OF THE INVENTION

This invention relates to a half-bridge circuit formed of a high side FET and a low side FET which are connected together at a power output node, and more specifically relates to a novel protection circuit for preventing the accidental turn on of the high side and low side FETs at the same time.

Half-bridge circuits are formed of two power MOSFETs or other similar power devices connected in series at a node which defines an output load terminal. The other terminal of the high side FET can be connected to a source of power, for example, the positive terminal of an automobile battery or the like. The other end of the low side FET can be connected to ground. The gate circuits of the high side and low side FETs are then appropriately controlled from an appropriate logic level signal control circuit at some suitable frequency and duty cycle so that the two power FETs turn on and off correctly to provide controlled output power to a load connected to the load terminal. Typical loads can be motor loads, for example, auxiliary motors for controlling various mechanisms in an automobile or the like. Such half bridges may be combined with other half bridges to build up any desired circuit (i.e., an H-bridge or three-phase drive) or may be used by themselves.

If, because of a malfunction in the gate control circuit, both the high side and low side FETs conduct simultaneously, a short circuit is produced from the power source to ground. This short circuit will carry sufficient current that the power FETs are likely to be destroyed. It is, therefore, important to ensure that both the high side and low side FETs do not conduct simultaneously. Great pains are usually taken with the gate control circuits to ensure against this occurrence. However, it is possible that such circuits fail, or that a lead to the gate circuit might be broken, in which case the gate-to-source potential can increase through capacitive coupling from the drain, thereby leading to the accidental turn on of both the high side and low side MOSFETs.

BRIEF DESCRIPTION OF THE INVENTION

In accordance with the present invention, a novel protective FET of small size compared to the size of the two power FETs of the half bridge is provided and is connected at points very close to the two gate structures of the two power FETs. The protective FET has its main terminals connected to the gate of the high side power FET and to ground. Its gate is connected to the gate of the low side power FET.

Accordingly, if gate potential appears simultaneously on the gates of the two power MOSFETs (either due to a malfunction of the gate drive circuit or a breakage of a gate wire and the capacitive charging of the power FET gate to a turn-on voltage), the gate of the auxiliary MOSFET is turned on and voltage is applied to its drain. Therefore, the gate of the high side FET is shunted to ground and the high side FET is held in an off condition. Accordingly, the simultaneous turn on of both the high side FET and low side FET is prevented and the two power FETs are protected against accidental simultaneous turn on regardless of the source of the error which applies simultaneous gate voltage to both FETs.

In accordance with one feature of the invention, the power MOSFETs are mounted on leadframe(s) or other electrical conductor (i.e. thick film metallization) on a common substrate and are physically located as close together as is possible so that the auxiliary FET leads are connected in close proximity to the corresponding terminals of the power FETs. Therefore, the connections are sufficiently close that, if there is a breakage in the circuits leading to the gates of the FETs, this breakage will occur outside of the circuit connections between the control FET and the power FETs. Additionally, being in physically close proximity minimizes the response time of the control FET by minimizing circuit inductance.

It is also possible to use a discrete FET device mounted on the circuit board along with the drive circuit components, with the power FETs isolated and mounted on a heat sink. The discrete device provides protection except against a broken lead. It will protect in the event of a malfunction in the control or driver as well as in the event of timing problems where one device may turn on before the other member of the half bridge has turned off. This can occur especially when one driver is used for multiple circuits and especially when different FET die sizes are used within the half bridge.

Other features and advantages of the present invention will become apparent from the following description of the invention which refers to the accompanying drawings.

DETAILED DESCRIPTION OF THE DRAWINGS

Figure 1:
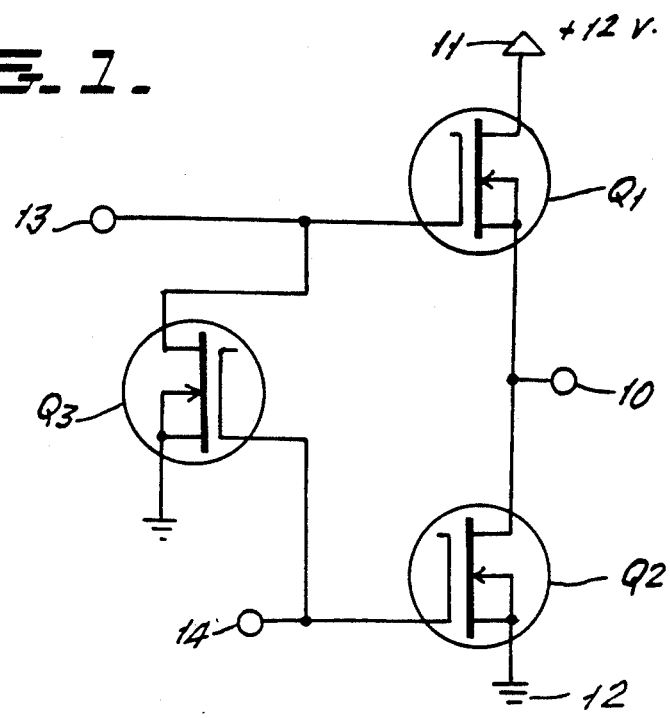
FIG. 1 is a circuit diagram of the present invention.

Referring first to FIG. 1, there is first shown a typical half bridge consisting of two N channel MOSFETs $Q_1$ and $Q_2$. The source of MOSFET $Q_1$ is electrically connected to the drain of MOSFET $Q_2$ and a load terminal 10 is connected to the node between MOSFETs $Q_1$ and $Q_2$. The drain of MOSFET $Q_1$ is connected to a power terminal 11 which can, for example, be connected to a source of battery voltage of +12 volts as would be found in a typical automotive system. Note, however, that the present invention can be applicable to any voltage range consistent with the FET ratings.

The source connection of transistor $Q_2$ is then shown in FIG. 1 as connected to the ground terminal 12. Each of MOSFETs $Q_1$ and $Q_2$ is further provided with terminals 13 and 14 which are connected to their respective gates.

In the half-bridge circuit described to this point in FIG. 1, the MOSFET $Q_1$ is the high side MOSFET and MOSFET $Q_2$ is the low side MOSFET. A load, for example, a motor connected at output terminal 10 will be operated in accordance with the turn on and turn off characteristics of the MOSFETs $Q_1$ and $Q_2$ under the control of a suitable controller driver circuit (not shown) which is connected to terminals 13 and 14.

It is imperative that terminals 13 and 14 are not simultaneously high since that will turn on transistors $Q_1$ and $Q_2$ simultaneously, thus causing the direct shorting of the power terminal 11 to the ground 12 through MOSFETs $Q_1$ and $Q_2$. This direct short is likely to damage one or both devices.

In accordance with the present invention, a novel MOSFET $Q_3$ of small size relative to MOSFETs $Q_1$ and $Q_2$ is provided in the circuit relationship as shown. Thus, in FIG. 1, MOSFET $Q_3$, which is also shown as an N channel enhancement type MOSFET, has its drain connected to the gate of MOSFET $Q_1$ and its gate connected to the gate of MOSFET $Q_2$. The source of MOSFET $Q_3$ is also connected to ground.

As a result of this connection of MOSFET $Q_3$, if, for any reason, high signals are applied simultaneously to terminals 13 and 14 and one device turns on before the second device is turned off, the high signal on the gate lead of transistor $Q_3$ (connected to gate 14) and the high signal connected to its drain from the gate lead 13 will cause the MOSFET $Q_3$ to turn on, thereby connecting gate lead 13 of MOSFET $Q_1$ to ground through the MOSFET $Q_3$. Consequently, MOSFET $Q_1$ is forcibly turned off so long as a high signal exists on both of leads 13 and 14. If the operation of the half bridge is normal, MOSFET $Q_3$ cannot turn on.

In the above, the novel circuit of FIG. 1 was described for N channel type MOSFETs. It will be apparent to those skilled in the art that the invention could be carried out using other FET devices, for example, IGBTs or mixtures of different kinds of FET devices.

Figure 2:
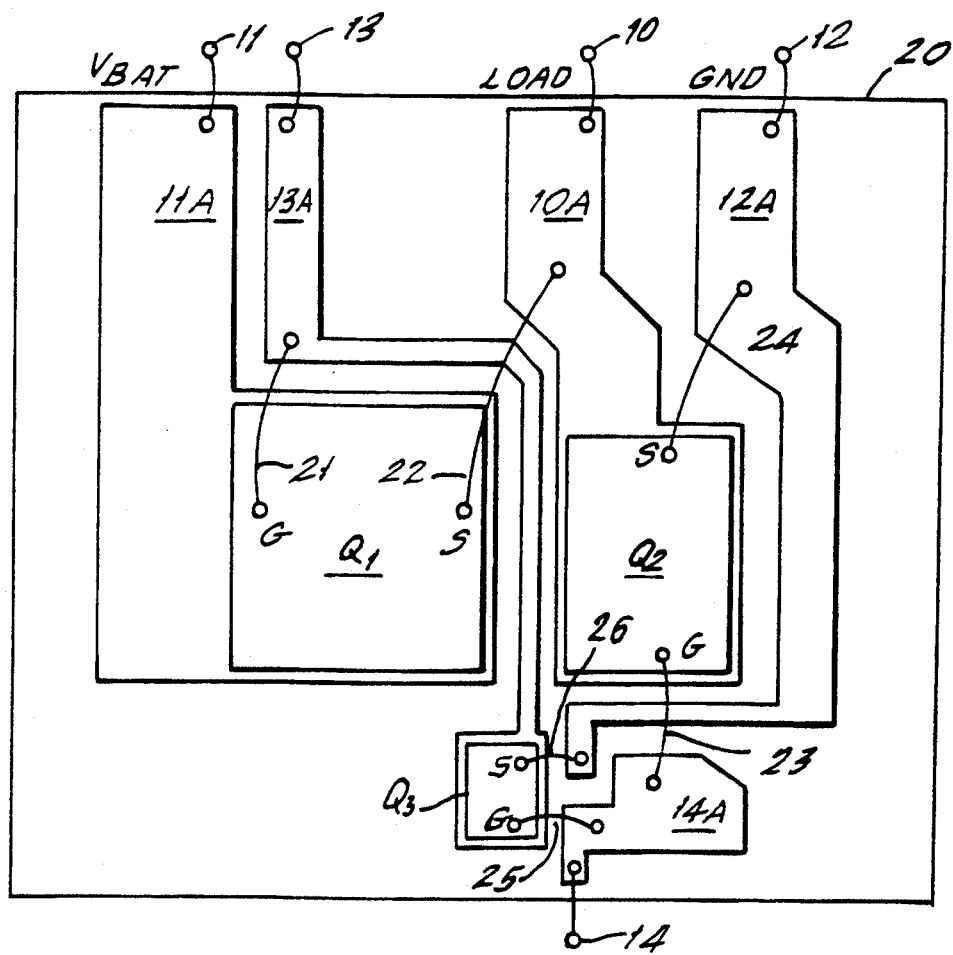
FIG. 2 is a plan view of the layout of leadframe segments and MOSFET die for carrying out the circuit of FIG. 1.

FIG. 2 illustrates a novel layout for carrying out the present invention in a device in which MOSFET chips are carried on bare leadframe elements. Referring to FIG. 2, there is shown in top view a suitable insulated substrate 20. A plurality of coplanar leadframe elements are attached to the substrate 20 and are shown by the numerals 10A, 11A, 12A, 13A and 14A which correspond to the terminals 10 through 14, respectively, of the circuit of FIG. 1. Each of the conductive leadframe segments 10A through 14A is electrically insulated from one another by being spaced on the substrate 20. Terminals 10 through 14 extend from the housing for electrical connection to external circuitry.

Each of the leadframe segments 10A through 14A is formed of a thin, conductive material, for example, copper. A bare MOSFET die $Q_1$ is bonded to the leadframe 11A, as shown in FIG. 2, so that the drain electrode on the bottom of the $Q_1$ die is attached with a conductive material (i.e. solder) to the leadframe 11A. A suitable heat spreader can be disposed between die $Q_1$ and leadframe 11A, if required for thermal spreading. In a typical embodiment of the invention, die $Q_1$ can be a size HEX 5 MOSFET die manufactured and sold by the International Rectifier Corporation, the assignee of the present invention. MOSFET $Q_2$ is similarly bonded to the leadframe 10A, whereby the drain electrode on the bottom of the die $Q_2$ in FIG. 2 is electrically connected to the leadframe strip 10. MOSFET die $Q_2$ can, for example, be a size HEX 3 die manufactured and sold by the International Rectifier Corporation, the assignee of the present invention.

Finally, the MOSFET $Q_3$ is similarly bonded to an enlarged portion of leadframe section 13A, as shown in FIG. 2, with its bottom drain connected to the frame 13A. The MOSFET die $Q_3$ can be a small die, for example a size HEX 1 or HEX 2 die available from the International Rectifier Corporation.

Preferably, the die $Q_3$ of FIG. 2 should be a 60 volt or 100 volt device for a 12 volt system. Die $Q_1$ and $Q_2$ will be 50V or 60V devices.

Each of the die $Q_1$, $Q_2$ and $Q_3$ of FIG. 2 has gate and source pads which are labeled "G" and "S", respectively. Wire bonded leads then electrically connect the source and gate pads to appropriate ones of the leadframes in order to complete the circuit of FIG. 1. Thus, in FIG. 2, wire 21 connects the gate of MOSFET $Q_1$ to leadframe 13A, wire 22 connects the source of MOSFET $Q_1$ to leadframe 10A, wire 23 connects the gate of MOSFET $Q_1$ to leadframe 14A, wire 24 connects the source of MOSFET $Q_2$ to leadframe segment 12A, wire 25 connects the gate of MOSFET $Q_3$ to leadframe 14A and wire 26 connects the source of MOSFET $Q_3$ to ground or leadframe seqment 12A.

It will be noted that, in the physical arrangement of FIG. 2, the die $Q_3$ is as close as possible to the die $Q_1$ and $Q_2$. Thus, no interruption can occur in the circuit connected to leadframe sections or terminals 13 and 14 and the circuit between MOSFET $Q_3$ and the power MOSFETs $Q_1$ and $Q_2$ should not open.

The upper surface of the assembly of FIG. 2 may then be coated with a silastic and a top cover is then secured to substrate 20. A heat sink can be connected to the bottom of substrate 20 to complete the assembly.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A protection circuit for first and second power FETs connected in series in a half-bridge circuit; said first and second power FETs having source, drain and gate electrodes; said source electrode of said first power FET connected to said drain electrode of said second power FET to define a load terminal; one of said source and drain electrodes of said second and first power FETs respectively defining a power terminal and the other defining a ground terminal; said protection circuit comprising a third FET having source, drain and gate electrodes; one of said source and drain electrodes of said third FET connected to said gate of said first FET and the other connected to said ground terminal; said gate electrode of said third FET connected to said gate electrode of said second FET, said gates of said first and second FETs being coupled to complementary driving signal sources; said third FET being nonconductive in the absence of gate signals to both said first and second power FETs which would turn on said power FETs simultaneously.

2. The circuit of claim 1 wherein said third FET has a current carrying capacity which is substantially less than that of either of said first or second FETs.

3. The circuit of claim 1 wherein said first, second and third FETs comprise respective thin chips supported on respective first, second and third flat coplanar conductive leadframes which are electrically insulated from one another.

4. The circuit of claim 1 wherein said third FET has a current carrying area which is substantially less than that of said first and second FETs.

5. The circuit of claim 3 wherein said drain electrode of each of said chips is on the bottom of its respective chip and is electrically bonded to its respective leadframe, and wherein said connections between said first, second and third FET source and gate electrodes include wires ultrasonically bonded between said chips and selected ones of said leadframes.

6. The circuit of claim 5 which further includes fourth and fifth leadframes which are coplanar with and insulated from one another and from said first, second and third leadframes; said fourth leadframe defining a ground terminal and connected to said source terminals of said second and third FETs; said fifth leadframe connected to said gate terminals of said second and third FETs.

7. A half bridge circuit protected against short circuit due to simultaneous turn on of its two main power FETs; said circuit comprising first and second series-connected power FETs and a third protective FET; each of said FETs having respective drain, source and gate terminals; the source and drain terminals of said first and second FETs being connected together; the gate and drain terminals of said first and third FETs being connected together; the gate terminals of said second and third FETs being connected together; the source electrodes of said second and third FETs connected together, said gates of said first and second FETs being coupled to independent complementary driving signal sources, said third FET being nonconductive in the absence of gate signals to both said first and second power FETs which would turn on said power FETs simultaneously.

8. The circuit of claim 7 wherein said drain terminal of said first FET defines a power terminal and wherein the connection between said source terminal of said first FET and said drain terminal of said second FET defines a load terminal, and wherein said source terminal of said third FET and said source terminal of said second FET are connected to a ground connection, whereby the presence of a turn-on signal simultaneously at said gate terminals of said first and second FETs will cause the turn on of said third MOSFET, whereby said gate electrode of said first FET is shunted to ground, thereby to prevent turn-on or to turn off said first FET.

9. The circuit of claim 8 wherein said first, second and third FETs comprise thin chips supported on respective first, second and third flat coplanar conductive leadframes which are electrically insulated from one another.

10. The circuit of claim 9 wherein said third FET has a current carrying area which is substantially less than that of said first and second FETs.

11. The circuit of claim 8 wherein said drain electrodes of each of said chips are on the bottom of their respective chip and are electrically bonded to their respective leadframe, and wherein said connections between said first, second and third FET source and gate electrodes include wires extending between said chips and selected ones of said leadframes.

12. The circuit of claim 11 which further includes fourth and fifth leadframes which are coplanar with and insulated from one another and from said first, second and third leadframes; said fourth leadframe defining a ground terminal and connected to said source terminals of said second and third FETs; said fifth leadframe connected to said gate terminals of said second and third FETS.

13. The circuit of claim 8 wherein said third FET is a discrete component.

14. The circuit of claim 13 wherein said first and second FETs comprise thin chips supported on respective leadframes which are insulated from one another.

15. The circuit of claim 8 wherein said first, second and third FETs are discrete components electrically isolated from one another.

* * * * *